United States Patent
Ujihara et al.

(10) Patent No.: US 8,344,354 B2
(45) Date of Patent: Jan. 1, 2013

(54) SPIN-POLARIZED ELECTRON SOURCE

(75) Inventors: Toru Ujihara, Nagoya (JP); Xiuguang Jin, Nagoya (JP); Yoshikazu Takeda, Nagoya (JP); Tsutomu Nakanishi, Nagoya (JP); Naoto Yamamoto, Nagoya (JP); Takashi Saka, Nagoya (JP); Toshihiro Kato, Kasugai (JP)

(73) Assignee: National University Corporation Nagoya University, Nagoya-shi, Aichi (JP)

( * ) Notice: Subject to any disclaimer, the term of this patent is extended or adjusted under 35 U.S.C. 154(b) by 0 days.

(21) Appl. No.: 12/736,270

(22) PCT Filed: Mar. 24, 2009

(86) PCT No.: PCT/JP2009/001304
§ 371 (c)(1),
(2), (4) Date: Dec. 9, 2010

(87) PCT Pub. No.: WO2009/119074
PCT Pub. Date: Oct. 1, 2009

(65) Prior Publication Data
US 2011/0089397 A1  Apr. 21, 2011

(30) Foreign Application Priority Data
Mar. 25, 2008  (JP) ................. 2008-079292

(51) Int. Cl.
*H01L 31/0304* (2006.01)
(52) U.S. Cl. ...... 257/18; 257/11; 257/190; 257/E31.059
(58) Field of Classification Search ............ 257/18
See application file for complete search history.

(56) References Cited

U.S. PATENT DOCUMENTS

| | | | | |
|---|---|---|---|---|
| 4,928,154 A | * | 5/1990 | Umeno et al. | 257/190 |
| 5,523,572 A | * | 6/1996 | Nakanishi et al. | 250/423 P |
| 5,874,747 A | * | 2/1999 | Redwing et al. | 257/77 |
| 5,877,510 A | * | 3/1999 | Baba et al. | 257/21 |

FOREIGN PATENT DOCUMENTS

| | | |
|---|---|---|
| JP | H06-028970 | 2/1994 |
| JP | H06-231676 | 8/1994 |
| JP | 7-320633 A | 12/1995 |
| JP | 2000-090817 | 3/2000 |
| JP | 3189444 | 5/2001 |
| JP | 2007-258119 | 10/2007 |
| JP | 2007-258119 A | 10/2007 |
| JP | 2008-198360 A | 8/2008 |

OTHER PUBLICATIONS

Nishitani, "Highly polarized electrons from GaAs-GaAsP and InGaAs-AlGaAs strained-layer superlattice photocathodes", Jounral of Applied Physics, vol. 97, Issue 9, pp. 094907-094907-6, May 2005.*

* cited by examiner

*Primary Examiner* — Jerome Jackson, Jr.
(74) *Attorney, Agent, or Firm* — McGinn IP Law Group, PLLC

(57) ABSTRACT

A spin-polarized electron generating device includes a substrate, a buffer layer, a strained superlattice layer formed on the buffer layer, and an intermediate layer formed of a crystal having a lattice constant greater than a lattice constant of a crystal of the buffer layer, the intermediate layer intervening between the substrate and the buffer layer. The buffer layer includes cracks formed in a direction perpendicular to the substrate by tensile strain.

17 Claims, 10 Drawing Sheets

FIG.5
AFM IMAGE (5 μm × 5 μm)
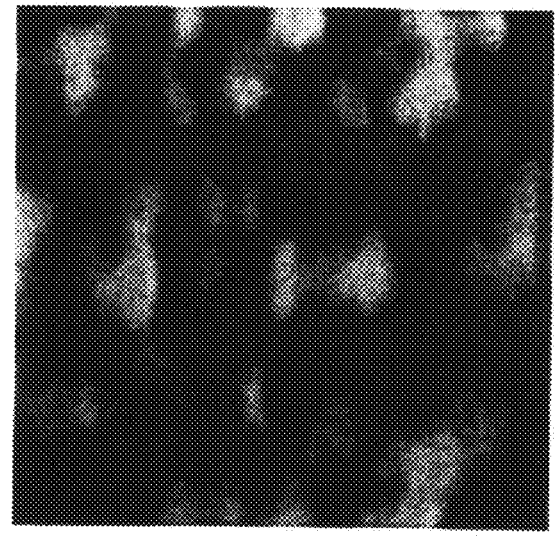
(a) WITH INTERMEDIATE LAYER
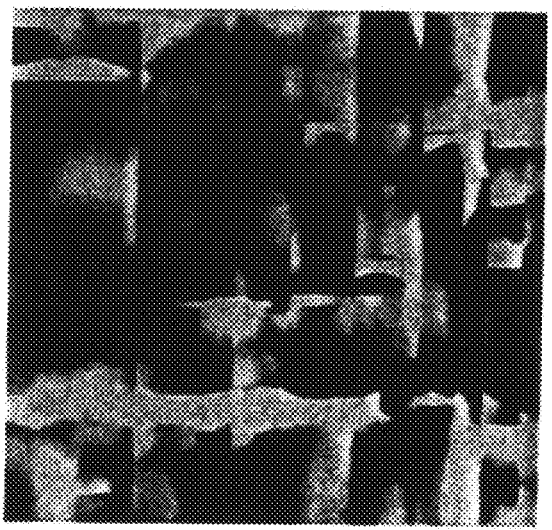
(b) WITHOUT INTERMEDIATE LAYER

SPIN-POLARIZED ELECTRON SOURCE

TECHNICAL FIELD

The present invention relates to a spin-polarized electron generating device (electron source) which employs a strained superlattice layer, and more particularly, the invention relates to a structure for improving crystallinity of the strained superlattice layer in order to enhance spin polarization and external quantum efficiency.

BACKGROUND ART

A spin-polarized electron generating device is expected to be used in a spin-polarized low-energy electron microscope for observing a magnetic domain structure and in elementary-particle research in which elementary particles are generated by collision between protons and spin-polarized electrons. In these fields, particularly, high polarization and high external quantum efficiency are required. At present, a semiconductor photocathode is mainly used as a spin-polarized electron generating device. In a semiconductor photocathode, electrons are excited with irradiation light, and the excited electrons are extracted from its surface, thereby yielding an electron beam. In the case where the semiconductor photocathode is used as a spin-polarized electron generating device, by using circularly polarized light as excitation light, the spin of excited electrons is polarized; in this manner, the semiconductor photocathode functions as a spin-polarized electron generating device.

The principle of spin polarization in a GaAs semiconductor photocathode will be described. Circularly polarized light with which the semiconductor photocathode is irradiated excites electrons from a heavy-hole band and a light-hole band to a conduction band. At this time, electrons having different spins are excited from the bands at a ratio of 3:1. As a result, the spin of an electron beam output from the cathode is polarized, whereby a spin-polarized electron beam is obtained.

Regarding a spin-polarized electron generating device using a single layer of strained GaAs semiconductor, a technique disclosed in Patent Documents 1, 2, and 3 mentioned below is known. The technique improves spin polarization by imposition of strain on a GaAs semiconductor layer. In GaAs semiconductor, a heavy-hole band and a light-hole band are degenerated in the valence band at Γ point; thus, electrons are excited simultaneously from the two bands. If the valence band is split into the two bands by breaking degeneracy, spin electrons are excited from only one of the bands; thus, in principle, a spin polarization of 100% can be achieved. As for a band splitting method, there is a method of imposing strain on semiconductor. According to Patent Documents 1 to 3, on a GaAs substrate, a GaAsP crystalline active layer different in lattice constant from the GaAs substrate is epitaxially grown so as to impose strain in the GaAsP layer through lattice mismatch, whereby a spin polarization of 50% or higher is achieved through associated splitting of the valence band of GaAsP. Further, underlaying the active layer with GaAsP different in composition from the active layer, rather than forming the active layer directly on the GaAs substrate, is proposed for restraining degradation of crystallinity of the active layer.

Patent Document 4 mentioned below discloses a technique for improving spin polarization by use of a strained superlattice structure. A superlattice structure is such that semiconductor layers of two or more different band gaps, each layer having a thickness of 1 ML to several nm, are repetitively stacked together. In the case of electrons, a layer having lower energy level at the bottom of the conduction band is called a well layer; in the case of holes, a layer having higher energy level at the top of the valence band is called a well layer; and layers between which the well layer is sandwiched are called a barrier layer. Electrons and holes are confined in the well layer, whereby quantum levels are formed. Since the quantum level of heavy holes and that of light holes are formed in different energy regions, band splitting arises accordingly.

Further, a superlattice layer on which strain is imposed is called a strained superlattice structure. Through additive utilization of the strain and an effect yielded by quantum confinement, further band splitting is implemented. Patent Document 4 relates to a spin-polarized electron generating device having a GaAs—GaAsP strained superlattice structure formed on a GaAs substrate, and the spin-polarized electron generating device achieves a polarization of 90% or higher.

The technique disclosed in Patent Document 5 mentioned below relates to an electron generating device for generating a high-brightness polarized electron beam. For enhancement of brightness, an effective measure is to reduce the size of an electron beam generation region by convergence of excitation light. The invention of Patent Document 5 proposes a structure in which a photocathode is irradiated with excitation light from its back side, whereby the excitation light is converged by a lens without interference with a spin-polarized electron beam emitted from the front side of the photocathode. As for a semiconductor photocathode, Patent Document 5 discloses a newly invented GaAs—GaAsP strained superlattice structure formed on a GaP substrate which allows transmittance of excitation light. However, the structure is fails to provide high polarization.

Patent Document 1: Japanese Patent No. 3189444
Patent Document 2: Japanese Patent Application Laid-Open (kokai) No. H06-28970
Patent Document 3: Japanese Patent Application Laid-Open (kokai) No. H06-231676
Patent Document 4: Japanese Patent Application Laid-Open (kokai) No. 2000-90817
Patent Document 5: Japanese Patent Application Laid-Open (kokai) No. 2007-258119

DISCLOSURE OF THE INVENTION

Problems to be Solved by the Invention

According to the technique of Patent Document 4 mentioned above, through employment of a strained superlattice layer, the degeneracy of the valence band is broken to thereby split the valence band into a heavy-hole band and a light-hole band, and, by use of unidirectional, circularly polarized light, transition of electrons between a conduction band and a heavy-hole band is implemented with an absorption wavelength shifted toward a long-wavelength side. In principle, this technique can obtain a spin polarization of 100% under theoretical conditions.

FIG. 1 shows the configuration of a strained superlattice semiconductor photocathode. The polarization of the strained superlattice semiconductor photocathode is determined mainly by the degree of separation between a light-hole band and a heavy-hole band. These band structures depend on the compositions and thicknesses of well layers 401 and barrier layers 402 of a superlattice structure 4 as well as strains which are generated in the respective layers, and can be theoretically calculated by use of the Kronig-Penney model and the model solid theory. At this time, strains generated in the layers 401 and 402 are determined by the composition of a buffer layer 3 located beneath the layers 401 and 402. FIG. 2 shows, by way of example, a miniband structure of a GaAsP/GaAs superlattice structure formed on a GaAsP buffer layer. In the case of this structure, a split width between the heavy-hole band and the light-hole band is seen to be 107 meV. Theoretically, the greater the split width, the higher the polarization. In the thus-designed structure, by incidence of circularly polarized light having such a wavelength as to induce transition of electrons between the heavy-hole band and the conduction band, a spin polarization of 100% is theoretically obtained.

However, in actuality, the polarization does not reach 100%. In pursuit of the cause for this, the present inventors previously carried out extensive studies, and as a result, found the following cause. In this structure, many dislocations are introduced into a crystal and cause spin-flip scattering, resulting in a drop in polarization. Also, since introduction of dislocations into the strained superlattice structure causes capture of generated electrons, quantum efficiency also drops.

The present inventors have found that there are two main causes for introduction of dislocations. One cause is strain itself accumulated within the strained superlattice structure. The present inventors make proposition regarding the strain in unpublished Japanese Patent Application No. 2006-60673. By means of employment of a strain compensation structure in which, by imposition of reversely directed strains on well layers and barrier layers, accumulation of strain in the entire superlattice structure is restrained, the generation of dislocations can be reduced to a certain extent.

The other cause is lattice mismatch between the buffer layer and the substrate. Currently available substrate crystals are GaAs, GaP, InP, InAs, GaN, AlN, Si, Ge, SiC, sapphire, etc. The lattice constant of the buffer layer is determined, by use of the aforementioned theoretical calculation, according to the amount of strain to be imposed on the strained superlattice layer. In order to facilitate crystal growth on the substrate, material of the substrate must be selected in such a manner that the substrate and the strained superlattice layer have a relatively common composition and lattice constants close to each other. In the case of employment of a spin-polarized electron generating device of an excitation light transmission type in which excitation light is incident from the back side of the substrate, material of the substrate must be determined in view of a band gap for preventing light absorption in the substrate. In most cases, the thus-determined buffer layer and substrate do not coincide with each other in lattice constant. Thus, dislocations caused by lattice mismatch arise in the buffer layer. Also, dislocations in the buffer layer propagate to the superlattice structure, which epitaxially grows on the buffer layer, causing degradation in crystallinity of the superlattice structure. Since dislocations capture electrons, quantum efficiency also drops.

The present invention has been conceived to solve the above problems, and an object of the invention is to provide a spin-polarized electron generating device having high spin polarization and high external quantum efficiency while allowing a certain degree of freedom in selecting materials of the substrate, the buffer layer, and the strained superlattice layer.

Means for Solving the Problems

In a first aspect of the present invention, there is provided a spin-polarized electron generating device comprising a substrate, a buffer layer, and a strained superlattice layer formed on the buffer layer, characterized in that the device has an intermediate layer formed of a crystal having a lattice constant greater than that of a crystal used to form the buffer layer, the intermediate layer intervening between the substrate and the buffer layer.

That is, the gist of the present invention is provision of an intermediate layer formed of a crystal having a lattice constant greater than that of a crystal of the buffer layer, beneath the buffer layer adapted to impose strain on the superlattice layer for effectively separating two bands from each other by breaking degeneracy of the valence band of the strained superlattice layer. A characteristic feature of the present invention resides in that through employment of the intermediate layer, tensile strain is imposed on the buffer layer regardless of a crystal material of the substrate. Thus, the present invention imposes no particular limitation on material of the intermediate layer so long as the material has a lattice constant greater than that of the buffer layer for imposing tensile strain on the buffer layer. Desirably, the buffer layer has a composition having such lattice constant as to impose compressive strain on the strained superlattice layer. In this case, a heavy-hole band can be separated toward a side of low energy of holes, and a light-hole band can be separated toward a side of high energy of holes. Thus, the two valence bands can be separated from each other without intersection near the Γ point. Therefore, the spin-polarization can be increased with respect to spins which are excited in the strained superlattice.

Thus, a crystal used to form the buffer layer has a lattice constant smaller than that of at least a well layer of the strained superlattice layer. Of course, the buffer layer may be of a crystal having a lattice constant smaller than that of a barrier layer of the strained superlattice layer.

A second aspect of the present invention is directed to a specific embodiment of the first aspect, wherein the intermediate layer has a thickness equal to or greater than a critical film thickness. In order that the buffer layer can impose predetermined strain on the strained superlattice layer, desirably, the intermediate layer has a thickness equal to or greater than the critical thickness and is sufficiently strain-relaxed. By virtue of this feature, the strained superlattice layer receives predetermined strain only from the buffer layer underlying the strained superlattice layer, so that the valence band of the strained superlattice layer can be effectively split as designed.

A third aspect of the present invention is directed to a specific embodiment of the first or second aspect, wherein the buffer layer has cracks formed therein in a direction perpendicular to the substrate by the effect of tensile strain. The cracks induce mosaic-like appearance to the buffer layer. The present inventors have found the following. When tensile strain is imposed on the buffer layer, in order to relax the strain, cracks are formed locally at low density in a vertical direction. As a result, since the buffer layer does not form slip dislocations in an oblique direction, slip dislocations in an oblique direction do not propagate to the strained superlattice layer overlying the buffer layer, whereby the crystallinity of the strained superlattice layer is improved. That is, when compressive strain is imposed on the buffer layer, slip dislocations in an oblique direction are formed at high density in the buffer layer, and dislocation planes propagate to the strained superlattice layer, which epitaxially grows on the buffer layer; as a result, dislocations are formed at high density in the strained superlattice layer. By means of lowering dislocation density in the strained superlattice layer, spin polarization, and external quantum efficiency of polarized electrons can be improved.

A fourth aspect of the present invention is directed to a specific embodiment of any one of the first to third aspects, wherein the intermediate layer has a thickness so as not to be strained from the buffer layer when tensile strain imposed on the buffer layer is relaxed. When strain is imposed on the intermediate layer from the buffer layer, difficulty is encountered in imposing predetermined strain on the strained superlattice layer from the buffer layer. Thus, it is desirable for the intermediate layer to satisfy the requirement for thickness.

A fifth aspect of the present invention is directed to a specific embodiment of any one of the first to fourth aspects, the spin-polarized electron generating device is configured such that the strained superlattice layer is irradiated with excitation light from a back side of the substrate, and the intermediate layer has such a thickness as to allow transmittance of 50% to 100% of the excitation light. In order to impose predetermined strain on the strained superlattice layer, the thicker the intermediate layer, the more desirable. Thus, in the case where excitation light is incident from the back side of the substrate, since the excitation light must enter the strained superlattice layer without attenuation, desirably, the intermediate layer has such a thickness as to attain a transmittance of excitation light of 50% to 100% in the intermediate layer.

A sixth aspect of the present invention is directed to a specific embodiment of any one of the first to fifth aspects, the substrate is formed of GaP; the buffer layer is formed of $GaAs_xP_{1-x}$ ($0 \leq x \leq 1$), $Ga_yIn_{1-y}P$ ($0 \leq y \leq 1$), or $Ga_zIn_{1-z}As$ ($0 \leq z \leq 1$); and the intermediate layer is formed of a binary, ternary, quaternary, or quinary compound AlGaInAsP having a lattice constant greater than that of the buffer layer. In the case of this configuration, desirably, the strained superlattice layer is a superlattice formed of $Ga_sIn_{1-s}As$ ($0 \leq s \leq 1$) and $GaAs_tP_{1-t}$ ($0 \leq t \leq 1$), a superlattice formed of $Ga_sIn_{1-s}As$ ($0 \leq s \leq 1$) and $Ga_wIn_{1-w}P$ ($0 \leq w \leq 1$), a superlattice formed of $Ga_wIn_{1-w}P$ ($0 \leq w \leq 1$) and $GaAs_tP_{1-t}$ ($0 \leq t \leq 1$), a superlattice formed of $Ga_sIn_{1-s}As$ ($0 \leq s \leq 1$) of different compositional proportions, a superlattice formed of $GaAs_tP_{1-t}$ ($0 \leq t \leq 1$) of different compositional proportions, or $Ga_wIn_{1-w}P$ ($0 \leq w \leq 1$). The composition may contain Al. Of course, among binary, ternary, quaternary, and quinary compositions AlGaInAsP, a semiconductor composition having a small band gap and a semiconductor composition having a large band gap may be combined to form the strained superlattice layer. Of course, even in the case of use of a substrate other than a GaP substrate, the above-mentioned materials may be used to form the intermediate layer, the buffer layer, and the strained superlattice layer. The buffer layer employed is smaller in lattice constant than the intermediate layer, and is smaller in lattice constant than the well layer of the strained superlattice layer so as to impose compressive strain on the strained superlattice layer. Also, the buffer layer may be smaller in lattice constant than the barrier layer of the strained superlattice layer.

A seventh aspect of the present invention is directed to a specific embodiment of the sixth aspect, wherein the intermediate layer is formed of GaAs. In the case of this configuration, in addition to the combinations specified for the sixth invention, particularly desirably, a superlattice formed of GaAs and $GaAs_wP_{1-w}$ ($0 \leq w \leq 1$) is used as the strained superlattice layer. In the sixth or seventh aspect, the composition of the buffer layer may be identical with or different from that of the barrier layer of the strained superlattice layer. In the case of the aspect having this configuration, the spin-polarized electron generating device may be configured such that excitation light is incident into the strained superlattice layer from the back side of the substrate.

An eighth aspect of the present invention is directed to a specific embodiment of any one of the first to fifth aspect, wherein the substrate is formed of GaAs; the buffer layer is formed of $GaAs_xP_{1-x}$ ($0 \leq x \leq 1$), $Ga_yIn_{1-y}P$ ($0 \leq y \leq 1$), or $Ga_zIn_{1-z}As$ ($0 \leq z \leq 1$); and the intermediate layer is formed of a binary, ternary, quaternary, or quinary compound AlGaInAsP having a lattice constant greater than that of the buffer layer. In the case of this configuration, desirably, the strained superlattice layer is a superlattice formed of $Ga_sIn_{1-s}As$ ($0 \leq s \leq 1$) and $GaAs_tP_{1-t}$ ($0 \leq t \leq 1$), a superlattice formed of $Ga_sIn_{1-s}As$ ($0 \leq s \leq 1$) and $Ga_wIn_{1-w}P$ ($0 \leq w \leq 1$), a superlattice formed of $Ga_wIn_{1-w}P$ ($0 \leq w \leq 1$) and $GaAs_tP_{1-t}$ ($0 \leq t \leq 1$), a superlattice formed of $Ga_sIn_{1-s}As$ ($0 \leq s \leq 1$) of different compositional proportions, a superlattice formed of $GaAs_tP_{1-t}$ ($0 \leq t \leq 1$) of different compositional proportions, or $Ga_wIn_{1-w}P$ ($0 \leq w \leq 1$). The composition may contain Al. Of course, among binary, ternary, quaternary, and quinary compositions AlGaInAsP, a semiconductor composition having a small band gap and a semiconductor composition having a large band gap may be combined to form the strained superlattice layer. Of course, even in the case of use of a substrate other than a GaAs substrate, the above-mentioned materials may be used to form the intermediate layer, the buffer layer, and the strained superlattice layer. The buffer layer employed is smaller in lattice constant than the intermediate layer, and is smaller in lattice constant than the well layer of the strained superlattice layer so as to impose compressive strain on the strained superlattice layer. The buffer layer may be smaller in lattice constant than the barrier layer.

A ninth aspect of the present invention is directed to a specific embodiment of the eighth aspect, wherein the intermediate layer is formed of InAs. In the case of this configuration, in addition to the combinations specified for the eighth invention, particularly desirably, a superlattice formed of $Ga_zIn_{1-z}As$ ($0 \leq z \leq 1$) and $Ga_yIn_{1-y}P$ ($0 \leq y \leq 1$) is used as the strained superlattice layer. In the case of the aspect having this structure, the spin-polarized electron generating device may be configured such that excitation light having a long wavelength of, for example, 900 nm is incident from the back side of the substrate, such a long wavelength facilitating formation of a large-output semiconductor laser.

A tenth aspect of the present invention is directed to a specific embodiment of any one of the first to fifth aspects, wherein the substrate is formed of GaN; the buffer layer is formed of $Al_xGa_{1-x}N$ ($0 \leq x \leq 1$) or $Ga_yIn_{1-y}N$ ($0 \leq y \leq 1$); and the intermediate layer is formed of a binary, ternary, or quaternary compound AlGaInN having a lattice constant greater than that of the buffer layer. In the case of this configuration, desirably, the strained superlattice layer is a superlattice formed of $Ga_sIn_{1-s}N$ ($0 \leq s \leq 1$) and $Al_tGa_{1-t}N$ ($0 \leq t \leq 1$). Also, desirably, the strained superlattice layer is a superlattice formed of $Ga_sIn_{1-s}N$ ($0 \leq s \leq 1$) of different compositional proportions or a superlattice formed of $Al_tGa_{1-t}N$ ($0 \leq t \leq 1$) of different compositional proportions. Of course, among binary, ternary, quaternary, and quinary compositions AlGaInN, a semiconductor composition having a small band gap and a semiconductor composition having a large band gap may be combined to form the strained superlattice layer. Of course, even in the case of use of a substrate other than a GaN substrate, the above-mentioned materials may be used to form the intermediate layer, the buffer layer, and the strained superlattice layer. The buffer layer employed is smaller in lattice constant than the intermediate layer, and is smaller in lattice constant than the well layer of the strained superlattice layer so as to impose compressive strain on the strained superlattice layer. The buffer layer may be smaller in lattice constant than the barrier layer.

The eleventh aspect of the present invention is directed to a specific embodiment of the tenth aspect, wherein the intermediate layer is formed of InN. In the case of this configuration, in addition to the combinations specified for the tenth aspect, particularly desirably, a superlattice formed of $Ga_zIn_{1-z}N$ ($0 \leq z \leq 1$) and GaN is used as the strained superlattice layer. In the case of this configuration, excitation light can be incident from the back side of the substrate. Also, since the band gap is large, efficiency in extraction of spin-polarized electrons is improved, whereby external quantum efficiency can be enhanced.

Effects of the Invention

According to the present invention, since the intermediate layer formed of a crystal having a lattice constant greater than that of a crystal of the buffer layer is provided beneath the buffer layer, tensile strain can be imposed on the buffer layer, whereby dislocation density of the strained superlattice layer on the buffer layer can be reduced. As a result, the spin-flip scattering of excited electrons caused by dislocations and the capture of electrons by dislocations reduce, so that spin polarization of electrons excited in the conduction band of the strained superlattice layer can be increased, and external quantum efficiency can be improved. That is, regardless of the choice of the materials of the buffer layer and the substrate, tensile strain can be imposed on the buffer layer, thereby enabling provision of high polarization and high quantum efficiency through improvement of crystallinity of the strained superlattice layer.

BRIEF DESCRIPTION OF THE DRAWINGS

FIG. 5 A pair of AFM images, wherein (a) is an AFM image of a buffer layer grown with use of an intermediate layer in the structure of Example 1, and (b) is an AFM image of a buffer layer grown without use of an intermediate layer in the structure of Example 1.

DESCRIPTION OF REFERENCE NUMERALS

1, 10, 11, 12: substrate
20, 21, 22: intermediate layer
3, 30, 31, 32: buffer layer
4, 40, 41, 42: strained superlattice layer
50, 51, 52: cap layer

BEST MODES FOR CARRYING OUT THE INVENTION

Figure 3:
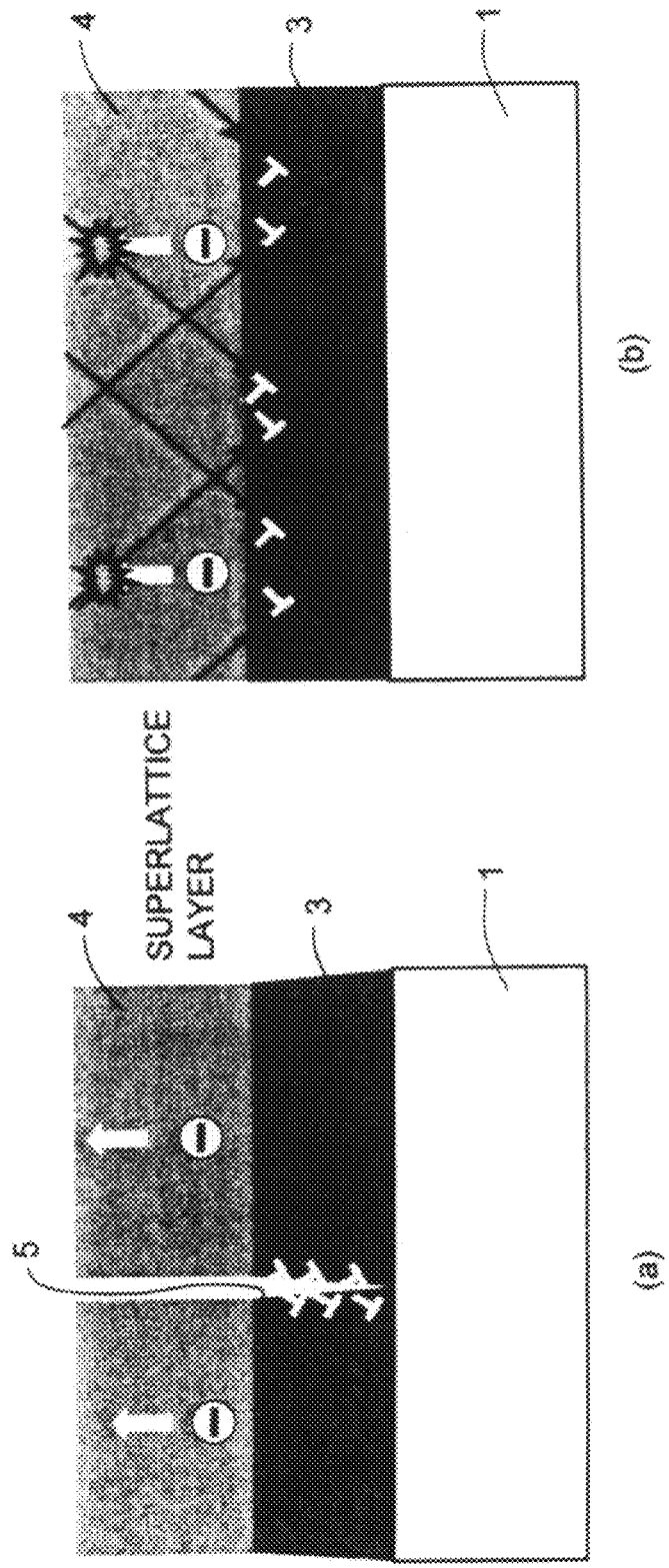
FIG. 3 A pair of cross-sectional views, wherein (a) is a cross-sectional view of a crystal in which tensile strain is imposed on the buffer layer, and (b) is a cross-sectional view of a crystal in which compressive strain is imposed on the buffer layer.

The present invention relates to a structure for lowering dislocation density, which might otherwise cause a drop in polarization and quantum efficiency in a superlattice layer. As shown in FIG. 3, in the case where the lattice constant of a buffer layer 3 is greater than that of a substrate 1, in-plane biaxial compressive strain is imposed in the buffer layer 3. When the thickness of the buffer layer 3 increases and exceeds a critical film thickness, dislocations are introduced to relax the strain. As shown in FIG. 3(b), in the case where compressive strain is imposed on the buffer layer 3, dislocations are finely distributed at high density in a crystal.

In the case where the lattice constant of the buffer layer 3 is smaller than that of the substrate 1, in-plane biaxial tensile strain is imposed in the buffer layer 3. When the thickness of the buffer layer 3 exceeds the critical thickness, dislocations are also introduced; however, at the same time, cracks 5 extending perpendicular to substrate surface are formed. As a result, as shown in FIG. 3(a), a mosaic-like structure is formed by division by the cracks 5. The incidence density of the cracks 5 is far lower as compared with dislocation density associated with compressive strain as shown in FIG. 3(b). In the case of tensile strain, because of release of strain by cracking, a condition of low dislocation density is held within the mosaic-like structure surrounded by the cracks 5. Therefore, the probability of scattering of excited electrons by dislocations reduces, and polarization and quantum efficiency increase.

Among electrons excited in the superlattice layer, those which advance perpendicularly to the substrate are extracted into a vacuum. In this connection, slip dislocations hinder advancement of electrons which advance perpendicularly to the substrate, thereby causing spin-flip scattering. By contrast, since cracks are in parallel with the advancing direction of electrons, electrons are not scattered by cracks, so that the cracks do not cause spin-flip scattering.

As mentioned above, the lattice constant of the buffer layer 3 which is designed for effectively splitting the valence band by imposition of strain on the superlattice layer 4 is not always smaller than that of the substrate 1. For example, for transmitting excitation light through the substrate 1, a substrate having a large band gap must be selected. Generally, material having a large band gap is small in lattice constant. In the case of using a GaP substrate for the purpose of transmitting excitation light therethrough, and forming a buffer layer on the GaP substrate and a GaAsP/GaAs superlattice layer on the buffer layer, the lattice constant of the buffer layer becomes greater than that of the substrate. In this structure, compressive strain in the buffer layer is relaxed; slip dislocations are generated at high density in the buffer layer; and the dislocations propagate to the strained superlattice layer, whereby dislocation density of the strained superlattice layer increases, resulting in a drop in spin polarization and quantum efficiency.

The composition of the buffer layer is determined by theoretical calculation; the substrate is selected from among currently available ones; and selection of the substrate is limited by a purpose. Thus, the magnitude relationship of lattice constant between the substrate and the buffer cannot be arbitrarily selected. According to the present invention, in order to impose tensile strain on the buffer layer whichever material of the substrate and the buffer layer may be selected, the intermediate layer whose lattice constant is greater than that of the buffer layer is introduced between the substrate and the buffer layer. According to the present invention, through employment of the intermediate layer, even in the case of formation of a superlattice layer of any type, cracks are formed in the buffer layer in a direction perpendicular to the substrate to thereby impart a mosaic-like structure to the buffer layer, thereby providing high spin polarization of excited electrons and high quantum efficiency through improvement of crystallinity of the strained superlattice layer.

Most desirably, the intermediate layer satisfies the following four requirements. However, in the present invention, requirement 1 is a mandatory one, and other requirements are additional ones which are desirably satisfied.
1. The intermediate layer must be greater in lattice constant than the buffer layer.
2. Strain of the intermediate layer must be sufficiently relaxed. (The intermediate layer must have a thickness equal to or greater than a critical film thickness.)
3. When tensile strain of the buffer layer is relaxed, the intermediate layer must be hardly strained. (The intermediate layer has such a sufficient thickness that the intermediate layer is not strained by the influence of the buffer layer.)
4. In the case of a spin-polarized electron generating device of transmission type, in order to prevent a drop in electron excitation efficiency in the strained superlattice layer, the intermediate layer must have such a small thickness as to allow transmittance of 50% to 100% of incident excitation light.

Material and composition of intermediate layer the lattice constant of which is greater than that of the buffer layer are selected for the intermediate layer. Since the intermediate layer epitaxially grows on the substrate whose lattice constant is different from that of the intermediate layer, strain is generated in the intermediate layer. In order to effectively yield the function of the intermediate layer, thickness must be increased for sufficiently relaxing the strain. Thickness $h_i$ of the intermediate layer whose strain is relaxed is obtained by the following equation.

[F1]
$$h_i = \frac{b(1 - v_i \cos^2\theta)[\ln(h_i/b) + 1]}{8\pi|f|(1 + v_i)\cos\lambda} \quad (1)$$

Desirably, the intermediate layer has such a thickness that the intermediate layer is hardly strained until, through introduction of dislocations into the buffer layer, a mosaic-like structure is formed in the buffer layer by cracks extending in the vertical direction. Such a thickness $h_i'$ can be obtained by the following expression. Here, the ratio of strain of the intermediate layer to strain of the buffer layer is represented by x %.

[F2]
$$h_i' > \frac{A_b h_b a_i^2(a - a_b)}{A_i a_b^2(a_i - a)} = \frac{A_b h_b}{A_i} \frac{a_i^2}{a_b^2} \frac{100 - x}{x} \quad (2)$$

where

[F3]
$$A_b = \frac{2G_b}{a_b^2}\left(\frac{1 + v_b}{1 - v_b}\right) \quad (3)$$

[F4]
$$A_i = \frac{2G_i}{a_i^2}\left(\frac{1 + v_i}{1 - v_i}\right) \quad (4)$$

where
$G_b$: shear modulus of buffer layer
$G_i$: shear modulus of intermediate layer
$v_b$: Poisson's ratio of buffer layer
$v_i$: Poisson's ratio of intermediate layer
$a_b$: lattice constant of buffer layer
$a_i$: lattice constant of intermediate layer
$a_s$: lattice constant of substrate
$h_b$: film thickness at which a mosaic-like structure is formed in the buffer layer
b: Burgers vector of dislocation to be introduced into intermediate layer
θ: angle between dislocation line and Burgers vector
λ: angle between Burgers vector and direction of normal to interface between intermediate layer and substrate
f: degree of lattice mismatch between substrate and intermediate layer

[F5]
$$f = \frac{a_s - a_i}{a_i} \quad (5)$$

Desirably, x is smaller than about 5.
The film thickness of the intermediate layer must be greater than both values of $h_i$ and $h_i'$ mentioned above.

Further, in the case where the semiconductor photocathode is used as a transmission-type electron generating device, excitation light must go through the substrate and the intermediate layer. However, generally, since the lattice constant of the intermediate layer is greater than that of the superlattice layer, the band gap of the intermediate layer is smaller than that of the superlattice layer. Thus, in many cases, the intermediate layer can not transmit an excitation light of 100%. At that time, it is desirable to enable excitation light to pass through the intermediate layer at a level of 50% or more of incident intensity. To achieve this, transmittance of the intermediate layer must satisfy the following expression.

[F6]
$$1 > \exp(-\alpha h_i'') > 0.5 \quad (6)$$

α: transmittance of intermediate layer with respect to excitation light wavelength Since transmittance α depends on the composition of the intermediate layer, the composition of the intermediate layer desirably satisfies this requirement for transmittance. Further, in formula (6), the closer to 1 the value (the less the absorption of light in the intermediate layer), the closer to an optimum structure.

The critical film thickness $h_b$ in terms of formation of a mosaic-like structure in the buffer layer is theoretically obtained by the following expression.

[F7]
$$h_b = \frac{b_b(1 - v_b \cos^2\theta_b)[\ln(h_b/b_b) + 1]}{8\pi|f_b|(1 + v_b)\cos\lambda_b} \quad (7)$$

where
b$_b$: Burgers vector of dislocation to be introduced into buffer layer
θ$_b$: angle between dislocation line and Burgers vector in buffer layer
λ$_b$: angle between Burgers vector and direction of normal to interface between buffer layer and intermediate layer
f$_b$: lattice mismatch magnitude between buffer layer and intermediate layer

[F8]

$$f = \frac{a_i - a_b}{a_b} \tag{8}$$

In order to more accurately define the lower limit of the thickness of the buffer layer, an experimentally measured critical film thickness of the buffer layer may be used. Specifically, the intermediate layer is epitaxially grown on a certain substrate sufficiently thicker than an estimated optimum thickness. The buffer layer is epitaxially grown on the intermediate layer. Buffer layers of various thicknesses are grown, and the surfaces of the buffer layers are observed by a microscope or an atomic force microscope. At this time, a thickness at which cracking is confirmed may be taken as the critical film thickness h$_b$ of the buffer layer.

Desirably, a mosaic-like structure formed by introduction of dislocations has a width equal to or greater than the thickness of the superlattice layer and an electron diffusion length. This is for reducing the probability of scattering, by the cracks, of excited electrons in the strained superlattice layer.

EXAMPLE 1

Figure 4:
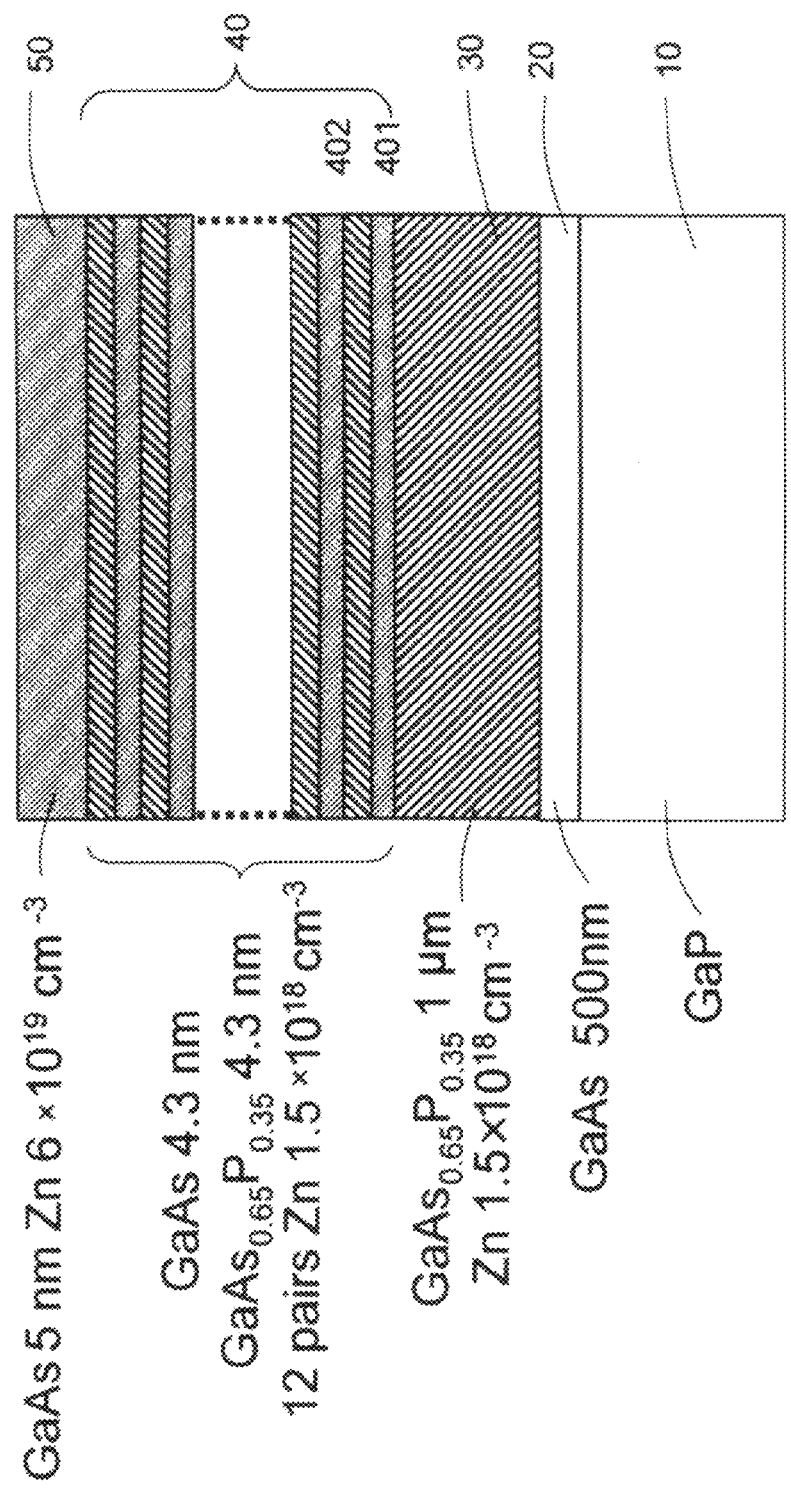
FIG. 4 Structural view of a spin-polarized electron generating device according to Example 1 of the present invention.

As shown in FIG. 4, Example 1 is a spin-polarized electron generating device which uses a GaP substrate and a GaAsP/GaAs strained superlattice layer. Specifically, an intermediate layer 20 formed of GaAs having a thickness of 500 nm is formed on a substrate 10 formed of GaP; a buffer layer 30 having a thickness of 1 μm is formed on the intermediate layer 20; a strained superlattice layer 40 is formed on the buffer layer 30; and a cap layer 50 having a thickness of 5 nm is formed on the strained superlattice layer 40.

This structure is a transmission-type strained superlattice semiconductor photocathode designed for use as a spin-polarized electron generating device of high polarization and high brightness. The strained superlattice layer 40 was designed as shown in FIG. 4 on the basis of theoretical calculation. Specifically, the buffer layer 30 is formed of GaAs$_{0.65}$P$_{0.35}$ having a thickness of 1 μm and doped with Zn at a concentration of 1.5×10$^{18}$ cm$^{-3}$. The strained superlattice layer 40 is composed of 12 pairs each consisting of a well layer 401 formed of GaAs having a thickness of 4.3 nm and a barrier layer 402 formed of GaAs$_{0.65}$P$_{0.35}$ having a thickness of 4.3 nm, and has a total thickness of 103.2 nm. The well layers 401 and the barrier layers 402 are doped with Zn at a concentration of 1.5×10$^{18}$ cm$^{-3}$. This is for forming a p-type semiconductor, in which excited electrons serve as minority carriers. On the strained superlattice layer 40, the cap layer 50 formed of GaAs having a thickness of 5 nm and doped with Zn at a concentration of 6×10$^{19}$ cm$^{-3}$ is formed.

Figure 1:
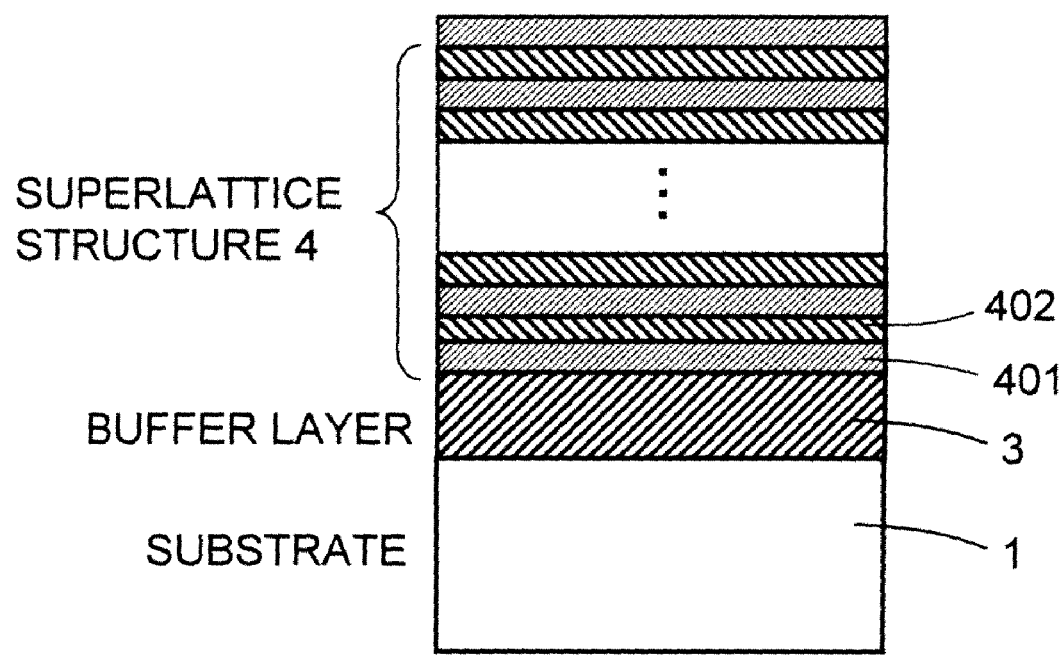
FIG. 1 Structural view of a spin-polarized electron generating device which employs a buffer layer and a strained superlattice layer.
Figure 2:
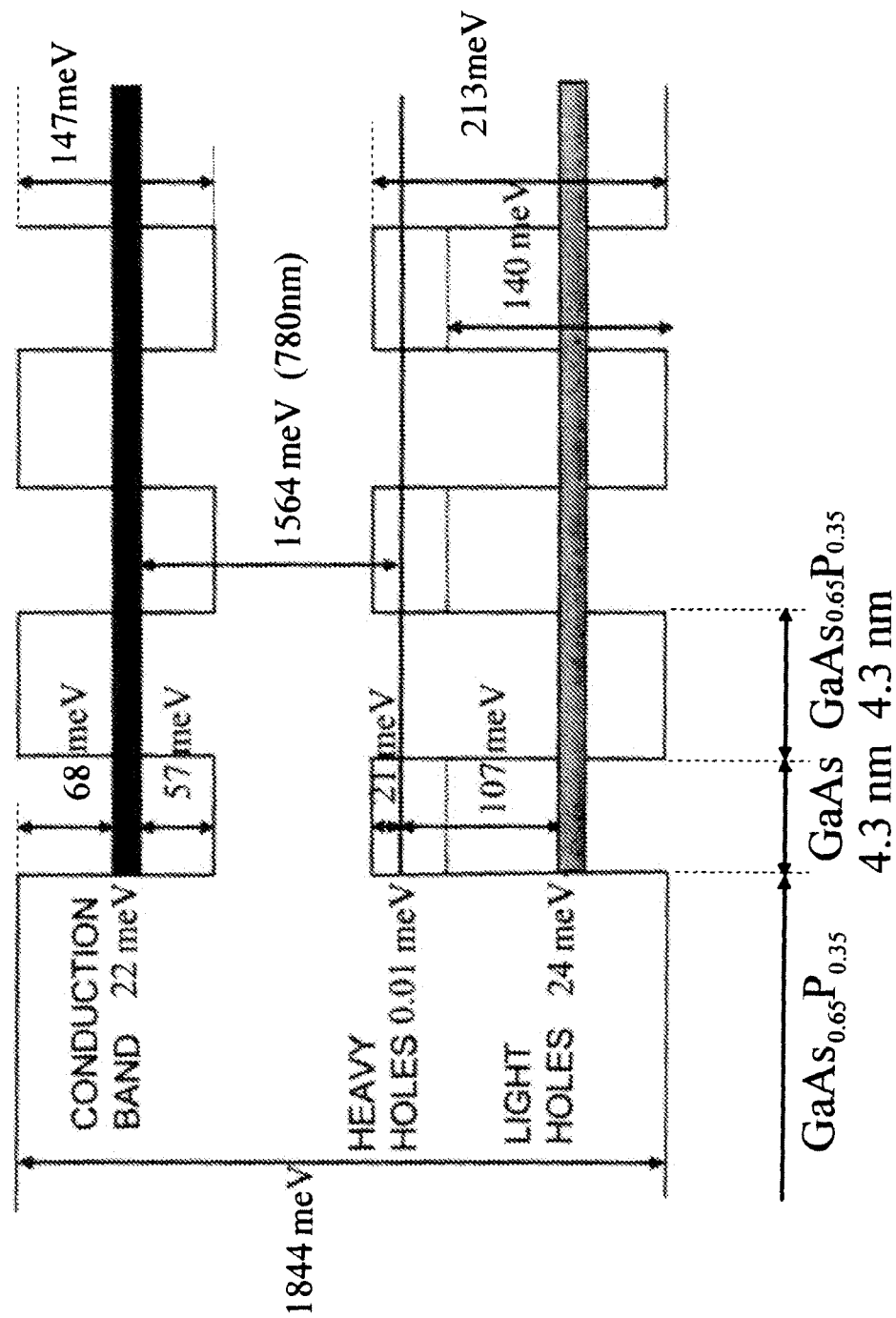
FIG. 2 Band diagram in the buffer layer and the strained superlattice layer.

A band structure calculated from this structure is shown in FIG. 2. In this structure, the split width between the heavy-hole band and the light-hole band is 107 meV; thus, theoretically, a spin polarization of 100% can be expected. Also, the band structure shows that an excitation light wavelength of about 780 nm is optimum for excitation of polarized electrons. In the case of a transmission-type spin-polarized electron generating device, a substrate must allow light having a wavelength of 780 nm to go therethrough; thus, a GaP substrate is selected as the substrate 10. In this case, while the buffer layer 30 has a lattice constant of 0.558 nm, the substrate 10 has a lattice constant of 0.539 nm; i.e., the lattice constant of a crystal of the buffer layer 30 is greater than that of a crystal of the substrate 10. Thus, when the buffer layer 30 is grown directly on the substrate 10, compressive strain is imposed on the buffer layer 30. In order to change the compressive strain to tensile strain for obtaining high polarization, the intermediate layer 20, which is an essential component of the present invention, is required. On the basis of design policy of the present invention, the present structure has introduced a GaAs layer having a thickness of 500 nm as the intermediate layer 20. In a combination of the buffer layer 30 and the intermediate layer 20 of the above-mentioned compositions, the critical film thickness of the buffer layer is 7 nm as calculated by formula (7). However, when the buffer layer 30 is excessively thin in comparison with the thickness of the strained superlattice, strain to be imposed on the strained superlattice is imposed on the buffer layer. To prevent this, it is desirable that the thickness of the buffer layer is about 10 times thicker than the thickness of the strained superlattice. Accordingly, it is determined for this reason that a thickness of the buffer layer is one micron. This thickness difference causes about 90% strain to be imposed on the strained superlattice and about 10% strain to be imposed on the buffer layer. No limitation is imposed on an increase in the thickness of the buffer layer so long as the entire device size is not excessively large.

FIG. 5 shows AFM images of surfaces of buffer layers. FIG. 5(b) is an AFM image of the buffer layer surface in the case where a GaAsP buffer layer is deposited directly on a GaP substrate. FIG. 5(a) is an AFM image of the buffer layer surface in the case where a GaAs intermediate layer is grown on the GaP substrate, and the GaAsP buffer layer is grown on the intermediate layer. As is apparent from FIG. 5(a), in the case of provision of the intervening intermediate layer, large crack-like defects are observed; further, it has been confirmed that an interval between the defects is about 0.5 μm to 1 μm. Crack density is lower than dislocation density associated with compressive strain.

Figure 6:
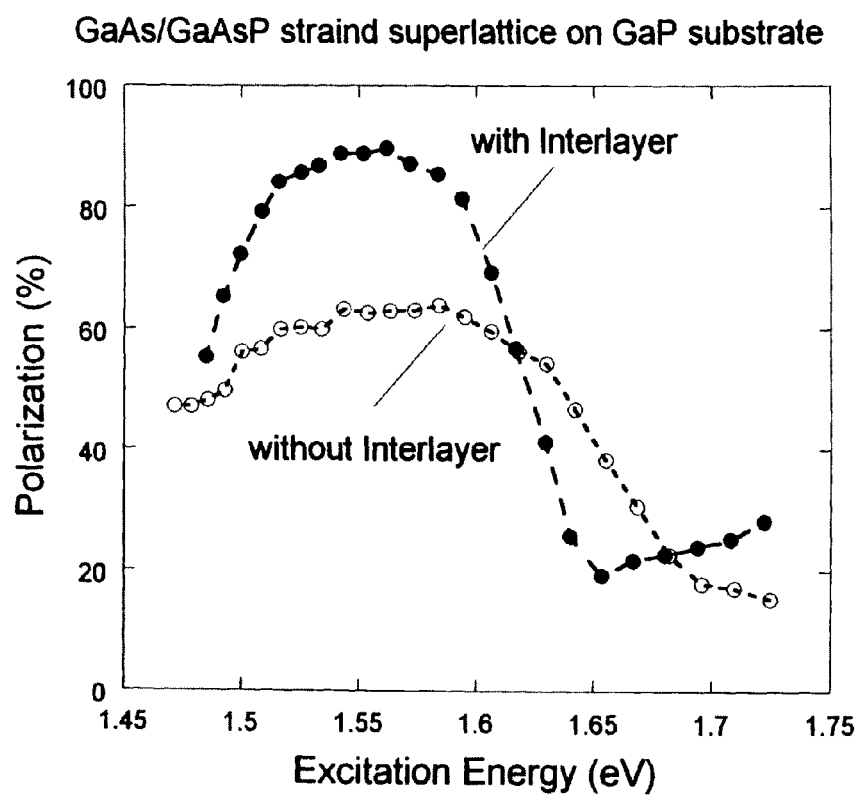
FIG. 6 A graph obtained by measurement of relationship between spin polarization and wavelength of the spin-polarized electron generating device of Example 1 and relationship between spin polarization and wavelength of a spin-polarized electron generating device which does not use an intermediate layer.

The designed strained superlattice layer 40 was formed on the buffer layer 30. Further, on the strained superlattice layer 40, the cap layer 50 formed of GaAs doped with Zn at high concentration was formed. Subsequently, the surface of the cap layer 50 was subjected to Cs:O deposition, thereby forming an NEA surface. This is for reducing the work function in order to facilitate extraction of electrons into vacuum. Through irradiation of the spin-polarized electron generating device having this structure with excitation light from the back side of the substrate 10, polarization was measured. FIG. 6 shows the results of the measurement. The horizontal axis represents excitation light wavelength, and the vertical axis represents spin polarization. The device which does not employ the GaAs intermediate layer exhibits a very low polarization of 70% or less. In contrast, the device which employs the GaAs intermediate layer has achieved a polarization of 90%. In the present example, the desirable thickness of the intermediate layer is 370 nm or more to 500 nm or less. When the thickness of the intermediate layer is less than 370 nm, the ratio of strain of the intermediate layer to strain of the buffer layer cannot be reduced to a value less than 5%. Accordingly, the thickness less than 370 nm is not desirable in the intermediate layer. Also, in the case of introduction of excitation light from the back side of the substrate, in order to reduce optical loss, it is more desirable that the thickness of the intermediate layer is as small as possible. When the thickness of the intermediate layer is greater than 500 nm, optical loss increases. Accordingly, the thickness greater than 500 nm is not desirable in the intermediate layer. It is more desirable that the thickness of the intermediate layer is 370 nm or more to 400 nm or less.

In the present example, GaAsP (including a binary composition) of any compositional proportions may be used to form the buffer layer so long as the crystal is smaller in lattice constant than the intermediate layer and has a lattice constant smaller than that of at least the well layer of the strained superlattice layer. A GaAsP/GaAsP superlattice of any compositional proportions may be used to form the strained superlattice layer. Also, GaAsP, GaInP, or GaInAs (all of which include a binary composition) may be used to form the intermediate layer so long as the aforementioned relationship of lattice constant is satisfied. In addition to a GaP substrate, other substrates may be used as the substrate.

EXAMPLE 2

Figure 7:
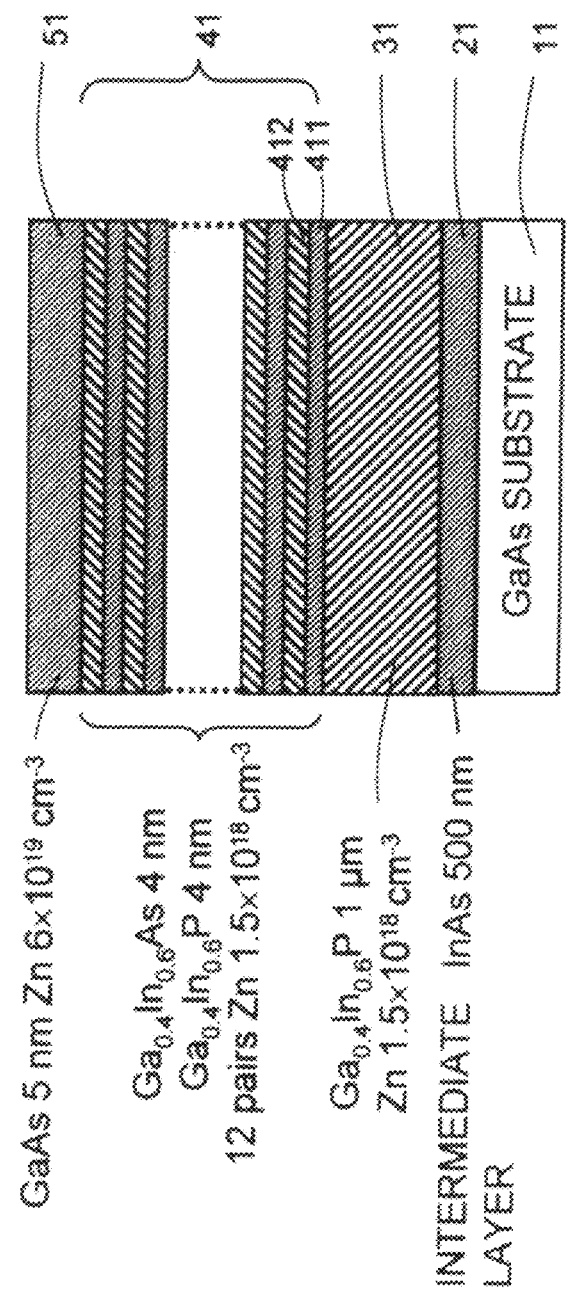
FIG. 7 Structural view of a spin-polarized electron generating device according to Example 2 of the present invention.

As shown in FIG. 7, Example 2 is a spin-polarized electron generating device which uses a GaAs substrate and a GaInP/GaInAs strained superlattice layer. For a certain purpose of use of an electron generating device, it is necessary to increase current which can be extracted from a photocathode. One method to increase current to be extracted is to increase power of excitation light. In application to an electron microscope or a like application, utilization of a small-sized, highly versatile semiconductor laser, rather than a large-sized laser, is effective. Many versatile semiconductor lasers having an emission wavelength of 900 nm to 1,000 nm and an output of several W are available. Therefore, utilization of a strained superlattice in which electrons are excited by excitation light in this wavelength range is effective. Also, for reduction of size, use of a transmission type is indispensable.

As shown in FIG. 7, the spin-polarized electron generating device of the present example is configured as follows: an intermediate layer 21 formed of InAs having a thickness of 500 nm is formed on a substrate 11 formed of GaAs; a buffer layer 31 having a thickness of 1 μm is formed on the intermediate layer 21; a strained superlattice layer 41 is formed on the buffer layer 31; and a cap layer 51 is formed on the strained superlattice layer 41. The buffer layer 31 is formed of $Ga_{0.4}In_{0.6}P$ having a thickness of 1 μm and doped with Zn at a concentration of $1.5\times10^{18}$ cm$^{-3}$. The strained superlattice layer 41 is composed of 12 pairs each consisting of a well layer 411 formed of $Ga_{0.4}In_{0.6}As$ having a thickness of 4 nm and a barrier layer 412 formed of $Ga_{0.4}In_{0.6}P$ having a thickness of 4 nm, and has a total thickness of 96 nm. The well layers 411 and the barrier layers 412 are doped with Zn at a concentration of $1.5\times10^{18}$ cm$^{-3}$. On the strained superlattice layer 41, the cap layer 51 formed of GaAs having a thickness of 5 nm and doped with Zn at a concentration of $6\times10^{19}$ cm$^{-3}$ is formed.

The spin-polarized electron generating device having this structure is excited by excitation light of 900 nm to 1,000 nm. The GaAs substrate is appropriate for allowing transmittance of light in this wavelength range. However, even in this case, the buffer layer becomes greater in lattice constant than the substrate. Thus, use of the intermediate layer of the present invention is effective. Utilization of such a versatile, high-intensity semiconductor laser has been demanded; however, only through utilization of the present invention, such a structure can be provided while high polarization is maintained. In a combination of the buffer layer 31 and the intermediate layer 21 of the above-mentioned compositions, the critical film thickness of the buffer layer is 1 nm as calculated by formula (7). However, when the buffer layer 31 is excessively thin in comparison with the thickness of the strained superlattice, strain to be imposed on the strained superlattice is imposed on the buffer layer. To prevent this, it is desirable that the thickness of the buffer layer is about 10 times thicker than the thickness of the strained superlattice. Accordingly, it is determined for this reason that a thickness of the buffer layer is one micron. This thickness difference causes about 90% strain to be imposed on the strained superlattice and about 10% strain to be imposed on the buffer layer. No limitation is imposed on an increase in the thickness of the buffer layer so long as the entire device size is not excessively large.

In the present example, the intermediate layer preferably has a thickness of 250 nm to 500 nm.

When the thickness of the intermediate layer is less than 250 nm, the ratio of strain of the intermediate layer to strain of the buffer layer cannot be reduced to a value less than 5%. Accordingly, the thickness less than 250 nm is not desirable in the intermediate layer. Also, in the case of introduction of excitation light from the back side of the substrate, in order to reduce optical loss, it is more desirable that the thickness of the intermediate layer is as small as possible. When the thickness of the intermediate layer is greater than 500 nm, optical loss increases. Accordingly, the thickness greater than 500 nm is not desirable in the intermediate layer. It is more desirable that the thickness of the intermediate layer is 250 nm or more to 400 nm or less. In the present example, GaInP (including a binary composition) of any compositional proportions may be used to form the buffer layer so long as the crystal is smaller in lattice constant than the intermediate layer and has a lattice constant smaller than that of at least the well layer of the strained superlattice layer. A GaInP/GaInP superlattice of any compositional proportions may be used to form the strained superlattice layer. Also, GaAsP, GaInP, or GaInAs (all of which include a binary composition) may be used to form the intermediate layer so long as the aforementioned relationship of lattice constant is satisfied. In addition to a GaAs substrate, other substrates may be used as the substrate.

EXAMPLE 3

Figure 8:
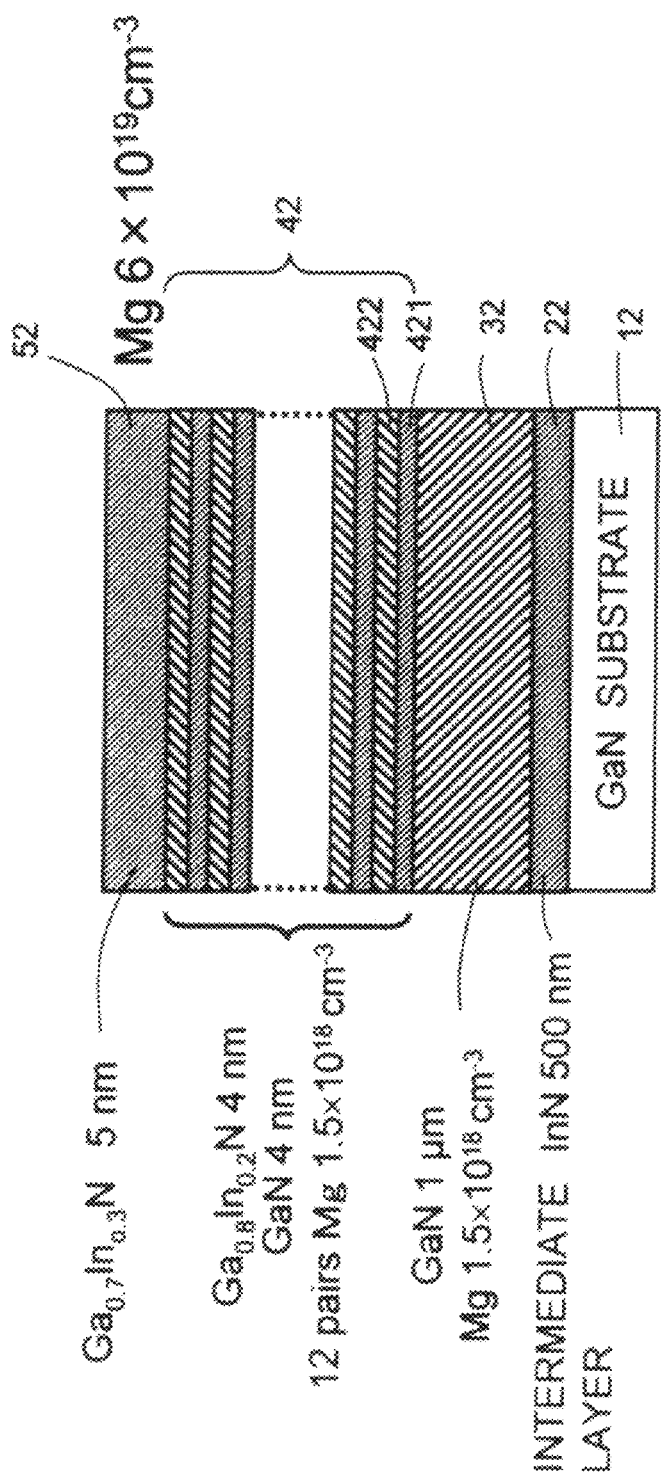
FIG. 8 Structural view of a spin-polarized electron generating device according to Example 3 of the present invention.

As shown in FIG. 8, Example 3 is a spin-polarized electron generating device which uses a GaN substrate and a GaN/GaInN strained superlattice layer. As shown in FIG. 8, the spin-polarized electron generating device of the present example is configured as follows: an intermediate layer 22 formed of InN having a thickness of 500 nm is formed on a substrate 12 formed of GaN; a buffer layer 32 having a thickness of 1 μm is formed on the intermediate layer 22; a strained superlattice layer 42 is formed on the buffer layer 32; and a cap layer 52 is formed on the strained superlattice layer 42. The buffer layer 32 is formed of GaN having a thickness of 1 μm and doped with Mg at a concentration of $1.5\times10^{18}$ cm$^{-3}$. The strained superlattice layer 42 is composed of 12 pairs each consisting of a well layer 421 formed of $Ga_{0.8}In_{0.2}N$ having a thickness of 4 nm and a barrier layer 422 formed of GaN having a thickness of 4 nm, and has a total thickness of 96 nm. The well layers 421 and the barrier layers 422 are doped with Mg at a concentration of $1.5\times10^{18}$ cm$^{-3}$. On the strained superlattice layer 42, the cap layer 52 formed of $Ga_{0.7}In_{0.3}N$ having a thickness of 5 nm and doped with Mg at a concentration of $6\times10^{19}$ cm$^{-3}$ is formed.

Generally, it is well known that the greater the band gap, the more the extraction of electrons from the photocathode surface is facilitated, resulting in increasing of extension efficiency and the service life of the device. For this reason, wide band gap material is promising. In a family of this material, a superlattice layer which is most feasible in view of crystallinity, etc. is GaN/GaInN. Also, GaN or AlN is used as the substrate. Thus, even in this case, the buffer layer becomes greater in lattice constant than the substrate. Therefore, use of the intermediate layer of the present invention is effective. In a combination of the buffer layer 32 and the intermediate layer 22 of the above-mentioned compositions, the critical film thickness of the buffer layer is 1 nm as calculated by formula (7). However, when the buffer layer 32 is excessively thin in comparison with the thickness of the strained superlattice, strain to be imposed on the strained superlattice is imposed on the buffer layer. To prevent this, it is desirable that the thickness of the buffer layer is about 10 times thicker than the thickness of the strained superlattice. Accordingly, it is determined for this reason that a thickness of the buffer layer is one micron. This thickness difference causes about 90% strain to be imposed on the strained superlattice and about 10% strain to be imposed on the buffer layer. No limitation is imposed on an increase in the thickness of the buffer layer so long as the entire device size is not excessively large.

In the present example, the desirable thickness of the intermediate layer is 85 nm or more to 500 nm or less. When the thickness of the intermediate layer is less than 85 nm, the ratio of strain of the intermediate layer to strain of the buffer layer cannot be reduced to a value less than 5%. Accordingly, the thickness less than 85 nm is not desirable in the intermediate layer. Also, in the case where excitation light having such a wavelength as to be absorbed by the intermediate layer is irradiated from the back side of the substrate, in order to reduce optical loss, it is more desirable that the thickness of the intermediate layer is as small as possible. For example, in the case of use of a wavelength of 430 nm, when the thickness of the intermediate layer is greater than 500 nm, optical loss increases. Accordingly, the thickness greater than 500 nm is not desirable in the intermediate layer. It is more desirable that the thickness of the intermediate layer is 85 nm or more to 400 nm or less. In the present example, AlGaN or GaInN (both of which include a binary composition) of any compositional proportions may be used to form the buffer layer so long as the crystal is smaller in lattice constant than the intermediate layer and has a lattice constant smaller than that of at least the well layer of the strained superlattice layer. An AlGaN/AlGaN superlattice of any compositional proportions and a GaInN/AlGaN superlattice of any compositional proportions may be used to form the strained superlattice layer. Also, GaInN, AlGaN, or AlGaInN (all of which include a binary composition) may be used to form the intermediate layer so long as the aforementioned relationship of lattice constant is satisfied. In addition to a GaN substrate, other substrates, such as substrates of sapphire, SiC, etc., may be used as the substrate.

EXAMPLE 4

Example 4, the procedure of Example 2 is performed, except that a well layers $Ga_{0.9}In_{0.1}As$ is used. The device of the present example has been found to be more appropriate for use with an excitation wavelength of 900 nm than is the device of Example 2.

In all of the above-described examples, the compositions and compositional proportions of the strained superlattice layer are merely described as a few examples. Other compositional proportions may be used, and compositions may differ from those of the above examples. In all of the examples, binary-composition materials are selected for the intermediate layer. However, ternary- and quaternary-composition materials can be selected for the intermediate layer so long as the intermediate layer is greater in lattice constant than the buffer layer. The difference of the lattice constant between the intermediate layer and the buffer layer is desirably not less than 0.1% of the lattice constant of buffer layer, more desirably not less than 0.5%, ((lattice constant of intermediate layer−lattice constant of buffer layer)/lattice constant of buffer layer).

Desirably, materials used to form the substrate, the intermediate layer, and the buffer layer are such that compositions and compositional proportions do not cause absorption of excitation light and such that the intermediate layer is greater in lattice constant than the buffer layer. In this case, external quantum efficiency of spin-polarized electrons can be greatly improved.

As for a manufacturing method, a well-known method, such as MOCVD process, may be used; thus, description thereof is omitted.

EXAMPLE 5

Figure 9:
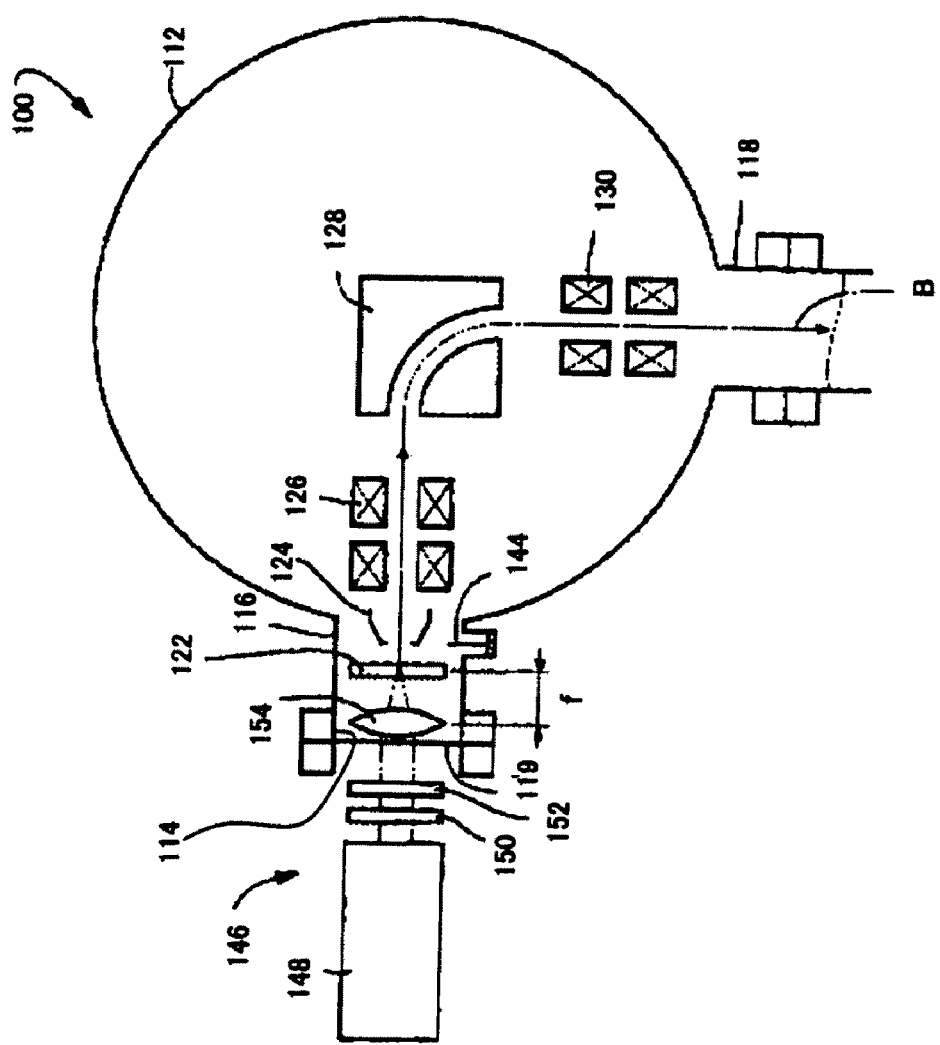
FIG. 9 Configurational view of a spin-polarized electron generating apparatus which uses the spin-polarized electron generating device of the present invention.

Next, a spin-polarized electron generating apparatus which employs the spin-polarized electron generating device of the present invention will be described. FIG. 9 is a schematic view of the configuration of a spin-polarized electron-beam generating apparatus 100. The spin-polarized electron-beam generating apparatus 100 includes a gastight vacuum container 112 connected to an evacuation system (not illustrated) and maintained at an ultrahigh vacuum. The vacuum container 112 includes a tubular port 116 having an opening 114 through which excitation light L is incident, and a tubular connection port 118 connected to a Mott scattering polarization measuring apparatus or a projection-type surface low-energy electron microscope (LEEM), and adapted to lead a spin-polarized electron beam B generated in the vacuum container 112 to the equipment. The opening 114 of the port 116 is closed in a gastight manner by a light transparent plate 119 made of quartz or the like.

The above-mentioned evacuation system consists of a rough evacuation system and a main evacuation system. The rough evacuation system includes a turbopump and a rotary pump which are connected in tandem and evacuate the vacuum container 112 to establish a high vacuum therein. The main evacuation system uses an ion pump and NEG pump for evacuating the vacuum container 112 whose entirety has been baked at about 200° C., thereby establishing therein an ultrahigh vacuum on the order of $10^{-10}$ Pa.

Figure 10:
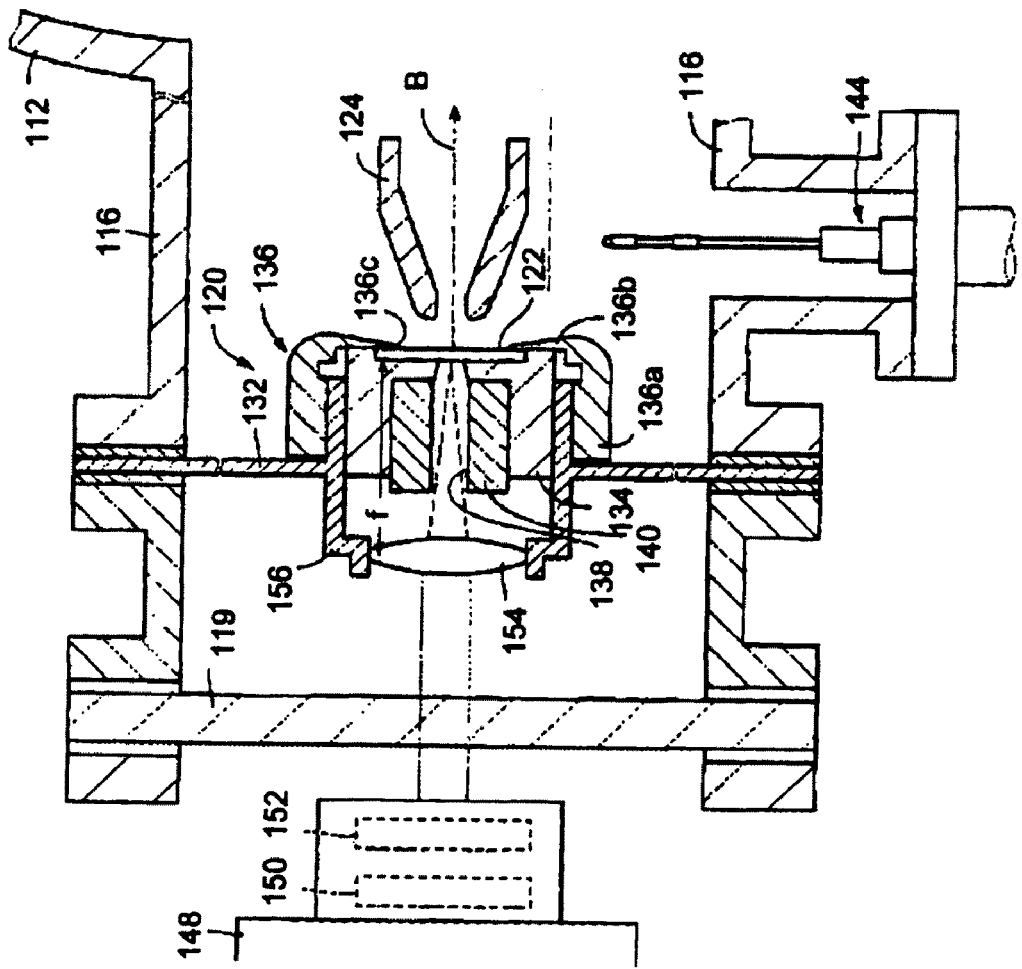
FIG. 10 Configurational view of a spin-polarized electron generating device installation region in the spin-polarized electron generating apparatus.

In the vacuum container 112, the following components are aligned at predetermined intervals: a polarized electron-beam generating device 122, which is held in alignment with the center of the opening 114 by an device retainer 120 shown in FIG. 10; a cylindrical anode electrode 124 supported by a support (not illustrated) and adapted to apply an electric field for extracting the spin-polarized electron beam B from the polarized electron-beam generating device 122; a cylindrical solenoid lens 126 for converging the spin-polarized electron beam B extracted by the anode electrode 124; and a deflecting electromagnet (spin manipulator) 128 for bending the transmission direction of the spin-polarized electron beam B at a right angle so as to direct the spin-polarized electron beam B toward the extraction port 118, thereby rendering the spin axis of polarized electrons, for example, orthogonal to the transmission direction. Also, the vacuum container 112 has a cylindrical solenoid lens 130 disposed between the port 118 and the deflecting electromagnet (spin manipulator) 128 and adapted to control the spin direction (azimuth) of the spin-polarized electron beam B.

As shown in detail in FIG. 10, the polarized electron generating device retainer 120 includes a cathode holder 132 whose cylindrical one end portion projects radially outward and is fixed on the port 116; a holding block 134, which is fixed by the port 116 of the vacuum container 112 via the cathode holder 132 and holds the polarized electron-beam generating device 122 in position at a peripheral portion of the device 122 in such a manner that opposite end surfaces of the device 122 are exposed; and a cathode electrode 136, which is fitted to the cathode holder 132 coaxially with the cylindrical anode electrode 124. The cathode electrode 136 assumes a closed-bottomed cylindrical form having a peripheral wall portion 136a and a bottom wall portion 136b. The bottom wall portion 136b has a center hole 136c, which extends through a central portion thereof for exposing a central portion of the polarized electron-beam generating device 122, and has a thickness which reduces from a peripheral portion of the bottom wall portion 136b toward the center hole 136c. The anode electrode 124 has such a taper shape that diameter reduces toward the cathode electrode 136, so as to maximize electric field intensity in the vicinity of the polarized electron-beam generating device 122 exposed through the center hole 136c. The anode electrode 124 and the cathode electrode 136 have mirror-finished surface in order to restrain dark current, and are formed of, for example, stainless steel.

The holding block 134 has a through hole 138 and a cylindrical heater 140. The through hole 138 extends through the holding block 134 for exposing a central portion of a surface on a side toward the substrate; i.e., a central portion of the back surface, of the polarized electron-beam generating device 122 held by the holding block 134. The cylindrical heater 140 is located radially outward of the through hole 138 and fitted into the holding block 134. The holding block 134 is formed of a metal material nonreactive with, for example, component elements of the polarized electron-beam generating device 122. Examples of such metal include molybdenum and tantalum.

In order to render a surface on a side opposite the substrate; i.e., an electron emission surface, of the polarized electron-beam generating device 122 a negative electron affinity (NEA) surface, a cesium emitting device 144 and an oxygen (O) introduction device (not illustrated) are provided within the port 116 of the vacuum container 112 for emitting cesium Cs and oxygen O, respectively, in the vicinity of the anode electrode 124 and the cathode electrode 136. The cesium emitting device 144 is configured, for example, such that $CsCrO_4$ and a reducing agent, together with a getter, are contained in a sleeve made of Ni—Cr alloy. By supplying current to the heater of the cesium emitting device 144 to generate heat, $CsCrO_4$ is reduced by heat, whereby cesium Cs is emitted. Through addition of cesium Cs and oxygen O to the surface of a cleaned surface layer of the polarized electron-beam generating device 122, a potential generated by an electrical double layer having a thickness of several atoms is formed, thereby lowering vacuum level. That is, negative electron affinity is established for emission, into vacuum, of polarized electrons in the conduction band, thereby enhancing quantum efficiency for obtaining the spin-polarized electron beam B. Notably, similar effect is yielded even when a device for introduction of nitrogen fluoride, such as nitrogen trifluoride ($NF_3$), in place of oxygen O, is provided for addition of cesium Cs and nitrogen fluoride to the electron emission surface.

The excitation light L is generated by an excitation light injector 146 and incident into the polarized electron-beam generating device 122 from the surface on a side toward the substrate; i.e., from the back surface, of the device 122. The excitation light injector 146 includes, for example, a laser light source 148; a linear polarizer 150 and a $\lambda/4$ wave plate 152 for converting laser light output from the laser light source 148 from linearly polarized light to circularly polarized light to thereby produce the excitation light L; and a convergence lens 154 adapted to converge the excitation light L and disposed within the vacuum container 112 in such a manner as to be supported coaxially with the anode electrode 124 by a lens support portion 156 projecting from the cathode holder 132 toward the light transparent plate 119. The convergence lens 154 causes the excitation light L to be incident at a small spot diameter into the polarized electron-beam generating device 122 from a substrate side through the light transparent plate 119 provided in such a manner as to close the opening 114 of the port 116 and through the through hole 138 formed in the holding block 134, and to converge on a superlattice semiconductor photoelectronic layer 166. The distance between the convergence lens 154 and the polarized electron-beam generating device 122; i.e., a focal distance f, is greater than the sum of the thickness of the light transparent plate 119 and the thickness of the holding block 134, but is greatly reduced as compared with the case of convergence on the surface, on a side opposite the substrate, of the polarized electron-beam generating device 122 through the anode electrode 124, the solenoid lens 126, and the deflecting electromagnet (spin manipulator) 128. The distance between the convergence lens 154 and the polarized electron-beam generating device 122 can be reduced than in the present apparatus example. For example, through employment of a system in which the polarized electron-beam generating device 122 undergoes negative electron affinity surface treatment (NEA activation) in another vacuum container, and the thus-treated polarized electron-beam generating device 122 is set to the cathode electrode 136 via a load lock mechanism, the cylindrical heater 140 becomes unnecessary, so that the distance between the convergence lens 154 and the polarized electron-beam generating device 122 can be within several mm.

The convergence lens 154 of the excitation light injector 146 may be provided externally of the vacuum container 112. By means of connection of a Mott scattering polarization measuring apparatus or a projection-type surface low-energy electron microscope (LEEM) to the port 118, the present spin-polarized electron generating apparatus can serve as a spin-polarized electron-beam applied apparatus, such as a Mott scattering polarization measuring apparatus or a' projection-type surface electron microscope.

The spin-polarized electron generating apparatus of the present example is configured to include a spin-polarized electron generating device and an excitation light injector for injecting excitation light into the semiconductor photoelectronic layer of the spin-polarized electron generating device and to generate spin-polarized electrons, whose spin direction is polarized, from the semiconductor photoelectronic layer by convergence of excitation light on the semiconductor photoelectronic layer, and such that the excitation light injector converges excitation light on the semiconductor photoelectronic layer from the substrate side of the spin-polarized electron generating device.

INDUSTRIAL APPLICABILITY

The present invention can be applied to spin electronics and to a polarized electron generating device of an electron microscope adapted to observe the magnetic domain structure of a magnetic recording medium material.

The invention claimed is:

1. A spin-polarized electron generating device comprising:
   a substrate;
   a buffer layer;
   a strained superlattice layer formed on the buffer layer; and
   an intermediate layer formed of a crystal having a lattice constant greater than a lattice constant of a crystal of the buffer layer, the intermediate layer intervening between the substrate and the buffer layer,
   wherein the buffer layer comprises cracks formed in a direction perpendicular to the substrate by tensile strain.

2. A spin-polarized electron generating device according to claim 1, wherein the intermediate layer has a thickness equal to or greater than a critical film thickness.

3. A spin-polarized electron generating device according to claim 1, wherein the intermediate layer has a thickness so as not to be strained from the buffer layer when tensile strain imposed on the buffer layer is relaxed.

4. A spin-polarized electron generating device according to of claim 2, wherein the intermediate layer has a thickness so as not to be strained from the buffer layer when tensile strain imposed on the buffer layer is relaxed.

5. A spin-polarized electron generating device according to claim 1, wherein the spin-polarized electron generating device is configured such that the strained superlattice layer is irradiated with excitation light from a back side of the substrate, and the intermediate layer has such a thickness as to allow passage of 50% to 100% of the excitation light.

6. A spin-polarized electron generating device according to claim 1, wherein the substrate is formed of GaP; the buffer layer is formed of any one selected from a group consisting of $GaAs_xP_{1-x}$, ($0 \leq x \leq 1$), $Ga_yIn_{1-y}P$ ($0 \leq y \leq 1$), and $Ga_zIn_{1-z}As$ ($0 \leq z \leq 1$); and the intermediate layer is formed of a binary, ternary, quaternary, or quinary compound AlGaInAsP having a lattice constant greater than that of the buffer layer.

7. A spin-polarized electron generating device according to claim 2, wherein the substrate is formed of GaP; the buffer layer is formed of any one selected from a group consisting of $GaAs_xP_{1-x}$($0x \leq 1$), $Ga_yIn_{1-y}P$ ($0 \leq y \leq 1$), and $Ga_zIn_{1-z}As$ ($0 \leq z \leq 1$); and the intermediate layer is formed of a binary, ternary, quaternary, or quinary compound AlGaInAsP having a lattice constant greater than that of the buffer layer.

8. A spin-polarized electron generating device according to claim 6, wherein the intermediate layer is formed of GaAs.

9. A spin-polarized electron generating device according to claim 1, wherein the substrate is formed of GaAs; the buffer layer is formed of any one selected from a group consisting of $GaAs_xP_{1-x}$ ($0x \leq 1$), $Ga_yIn_{1-y}P$ ($0 \leq y \leq 1$), and $Ga_zIn_{1-z}As$ ($0 \leq z \leq 1$); and the intermediate layer is formed of a binary, ternary, quaternary, or quinary compound AlGaInAsP having a lattice constant greater than that of the buffer layer.

10. A spin-polarized electron generating device according to claim 2, wherein the substrate is formed of GaAs; the buffer layer is formed of any one selected from a group consisting of $GaAs_xP_{1-x}$ ($0 \leq x \leq 1$), $Ga_yIn_{1-y}P$ ($0 \leq y \leq 1$), and $Ga_zIn_{1-z}As$ ($0 \leq z \leq 1$); and the intermediate layer is formed of a binary, ternary, quaternary, or quinary compound AlGaInAsP having a lattice constant greater than that of the buffer layer.

11. A spin-polarized electron generating device according to claim 9, wherein the intermediate layer is formed of InAs.

12. A spin-polarized electron generating device according to claim 1, wherein the substrate is formed of GaN; the buffer layer is formed of any one selected from a group consisting of $Al_xGa_{1-x}N$ ($0 \leq x \leq 1$) and $Ga_yIn_{1-y}N$ ($0 \leq y \leq 1$); and the intermediate layer is formed of a binary, ternary, or quaternary compound AlGaInN having a lattice constant greater than that of the buffer layer.

13. A spin-polarized electron generating device according to claim 2, wherein the substrate is formed of GaN; the buffer layer is formed of any one selected from a group consisting of $Al_xGa_{1-x}N$ ($0 \leq x \leq 1$) and $Ga_yIn_{1-y}N$ ($0 \leq y \leq 1$); and the intermediate layer is formed of a binary, ternary, or quaternary compound AlGaInN having a lattice constant greater than that of the buffer layer.

14. A spin-polarized electron generating device according to claim 12, wherein the intermediate layer is formed of InN.

15. A spin-polarized electron generating apparatus using a spin-polarized electron generating device according to claim 1.

16. A spin-polarized electron generating apparatus according to claim 15, wherein the spin-polarized electron generating apparatus is an electron microscope which uses the spin-polarized electron generating device as a spin-polarized electron generating device.

17. A spin-polarized electron generating device according to claim 1, wherein the cracks in the buffer layer are formed in a direction perpendicular to a surface of the substrate.

* * * * *

UNITED STATES PATENT AND TRADEMARK OFFICE
CERTIFICATE OF CORRECTION

PATENT NO. : 8,344,354 B2  Page 1 of 1
APPLICATION NO. : 12/736270
DATED : January 1, 2013
INVENTOR(S) : Toru Ujihara et al.

It is certified that error appears in the above-identified patent and that said Letters Patent is hereby corrected as shown below:

Col. 19, line 2 of claim 4, replace "of claim 2, wherein the intermediate layer has a thickness so" with -- claim 2, wherein the intermediate layer has a thickness so --;

Col. 19, line 4 of claim 6, replace "$GaAs_xP_{1-x'}$ ($0 \leq x \leq 1$), $Ga_yIn_{1-y}P$ ($0 \leq y \leq 1$), and $Ga_zIn_{1-z}As$" with -- $GaAs_xP_{1-x}$ ($0 \leq x \leq 1$), $Ga_yIn_{1-y}P$ ($0 \leq y \leq 1$), and $Ga_zIn_{1-z}As$ --;

Col. 19, line 4 of claim 7, replace "$GaAs_xP_{1-x}$ ($0x \leq 1$), $Ga_yIn_{1-y}P$ ($0 \leq y \leq 1$), and $Ga_zIn_{1-z}As$" with -- $GaAs_xP_{1-x}$ ($0 \leq x \leq 1$), $Ga_yIn_{1-y}P$ ($0 \leq y \leq 1$), and $Ga_zIn_{1-z}As$ --; and Col. 20, line 4 of claim 9, replace "$GaAs_xP_{1-x}$ ($0\ x \leq 1$), $Ga_yIn_{1-y}P$ ($0 \leq y \leq 1$), and $Ga_zIn_{1-z}As$" with -- $GaAs_xP_{1-x}$ ($0 \leq x \leq 1$), $Ga_yIn_{1-y}P$ ($0 \leq y \leq 1$), and $Ga_zIn_{1-z}As$ --.

Signed and Sealed this
Fifth Day of March, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,344,354 B2  
APPLICATION NO. : 12/736270  
DATED : January 1, 2013  
INVENTOR(S) : Toru Ujihara et al.

Page 1 of 1

It is certified that error appears in the above-identified patent and that said Letters Patent is hereby corrected as shown below:

IN THE CLAIMS

Column 19, line 22 (Claim 4, line 2) replace "of claim 2, wherein the intermediate layer has a thickness so" with -- claim 2, wherein the intermediate layer has a thickness so --;

Column 19, line 34 (Claim 6, line 4) replace "$GaAs_xP_{1-x'}$ ($0 \leq x \leq 1$), $Ga_yIn_{1-y}P$ ($0 \leq y \leq 1$), and $Ga_zIn_{1-z}As$" with -- $GaAs_xP_{1-x}$ ($0 \leq x \leq 1$), $Ga_yIn_{1-y}P$ ($0 \leq y \leq 1$), and $Ga_zIn_{1-z}As$ --;

Column 19, line 41 (Claim 7, line 4) replace "$GaAs_xP_{1-x}$ ($0x \leq 1$), $Ga_yIn_{1-y}P$ ($0 \leq y \leq 1$), and $Ga_zIn_{1-z}As$" with -- $GaAs_xP_{1-x}$ ($0 \leq x \leq 1$), $Ga_yIn_{1-y}P$ ($0 \leq y \leq 1$), and $Ga_zIn_{1-z}As$ --; and Column 20, line 4 (Claim 9, line 4) replace "$GaAs_xP_{1-x}$ ($0\ x \leq 1$), $Ga_yIn_{1-y}P$ ($0 \leq y \leq 1$), and $Ga_zIn_{1-z}As$" with -- $GaAs_xP_{1-x}$ ($0 \leq x \leq 1$), $Ga_yIn_{1-y}P$ ($0 \leq y \leq 1$), and $Ga_zIn_{1-z}As$ --.

This certificate supersedes the Certificate of Correction issued March 5, 2013.

Signed and Sealed this  
Ninth Day of April, 2013

Teresa Stanek Rea  
*Acting Director of the United States Patent and Trademark Office*